United States Patent
Lee et al.

(10) Patent No.: US 9,612,524 B2
(45) Date of Patent: Apr. 4, 2017

(54) REFLECTIVE MASK AND METHOD OF FABRICATING THE SAME

(71) Applicant: SK hynix Inc., Gyeonggi-do (KR)

(72) Inventors: In Hwan Lee, Seoul (KR); Sun Young Koo, Gyeonggi-do (KR); Seo Min Kim, Seoul (KR); Yong Dae Kim, Chungcheongbuk-do (KR); Jin Soo Kim, Seoul (KR); Byung Hoon Lee, Gyeonggi-do (KR); Mi Jeong Lim, Seoul (KR); Chang Moon Lim, Seoul (KR); Tae Joong Ha, Daejeon (KR); Yoon Suk Hyun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 14/735,896

(22) Filed: Jun. 10, 2015

(65) Prior Publication Data
US 2016/0209741 A1  Jul. 21, 2016

(30) Foreign Application Priority Data

Jan. 15, 2015 (KR) ........................ 10-2015-0007163

(51) Int. Cl.
*G03F 1/24* (2012.01)
*G03F 1/26* (2012.01)

(52) U.S. Cl.
CPC ...................................... *G03F 1/24* (2013.01)

(58) Field of Classification Search
None
See application file for complete search history.

(56) References Cited

U.S. PATENT DOCUMENTS 9,316,900 B2 *  4/2016  Shih .......................... G03F 1/24

FOREIGN PATENT DOCUMENTS

KR     1020020052468      7/2002
KR     1020110136495      12/2011

\* cited by examiner

*Primary Examiner* — Stephen Rosasco
(74) *Attorney, Agent, or Firm* — IP & T Group LLP

(57) ABSTRACT

A reflective mask includes a first reflection layer disposed on a mask substrate, a first capping layer disposed on the first reflection layer, a second reflection pattern disposed on a portion of the first capping layer, and a phase shifter disposed between the second reflection pattern and the first capping layer to cause a phase difference between a first light reflecting from the first reflection layer and a second light reflecting from the second reflection pattern. Related methods are also provided.

20 Claims, 19 Drawing Sheets

REFLECTIVE MASK AND METHOD OF FABRICATING THE SAME

CROSS-REFERENCE TO RELATED APPLICATIONS

The present application claims priority under 35 U.S.C 119(a) to Korean Application No. 10-2015-0007163, filed on Jan. 15, 2015, in the Korean intellectual property Office, which is herein incorporated by reference in its entirety as set forth in full.

BACKGROUND

1. Technical Field

Various embodiments of the present disclosure relate to lithography techniques and, more particularly, to a reflective mask used in extreme ultraviolet (EUV) lithography and methods of fabricating the same.

2. Related Art

Lithographic processes utilizing EUV rays have been developed to transfer fine pattern images from a photomask onto a wafer. The EUV rays have a short wave length of about 13.5 nanometers. Thus, a resolution of the lithographic processes utilizing the EUV rays may be improved. Photomasks used in the EUV lithographic processes have been mainly developed to have a reflective mask structure. That is, reflective masks have been widely used in the EUV lithographic processes. Each of the reflective masks includes a light reflection layer and light absorption patterns formed on a surface of a mask substrate. The light absorption patterns of the reflective masks may cause a mask shadowing effect. The mask shadowing effect may lead to an undesired phenomenon such as a pattern critical dimension (CD) difference between a horizontal exposure scanning direction and a vertical exposure scanning direction or a pattern shift.

SUMMARY

Various embodiments are directed to reflective masks used with extreme ultraviolet (EUV) rays and methods of fabricating the same.

According to an embodiment, a reflective mask includes a first reflection layer disposed on a mask substrate, a first capping layer disposed on the first reflection layer, a second reflection pattern disposed over a portion of the first capping layer to cause a first phase difference portion between first light reflecting from the first reflection layer and second light reflecting from the second reflection pattern, and a phase shifter disposed between the second reflection pattern and the first capping layer to cause an additional second phase difference portion between the first light and the second light.

According to another embodiment, a reflective mask includes a first reflection layer including a plurality of first stack layers which are stacked on a mask substrate, a first capping layer disposed on the first reflection layer, a second reflection pattern including a plurality of second stack patterns which are stacked on a portion of the first capping layer and the second reflection pattern causes a first phase difference portion between first light reflecting from the first reflection layer and second light reflecting from the second reflection pattern, and a phase shifter disposed between the second reflection pattern and the first capping layer to cause an additional second phase difference portion between the first light and the second light reflecting. Each of the plurality of first stack layers includes a first sub-reflection layer and a first spacer layer which are stacked, and each of the plurality of second stack patterns includes a second sub-reflection layer and a second spacer layer which are stacked. The number of the plurality of second stack patterns constituting the second reflection pattern is within the range of about 7 to about 16.

According to another embodiment, a reflective mask includes a first reflection layer including a plurality of first stack layers which are stacked on a mask substrate, a first capping layer disposed on the first reflection layer, a second reflection pattern including a plurality of second stack patterns which are stacked on a portion of the first capping layer, and the second reflection pattern causes a first phase difference portion between first light reflecting from the first reflection layer and second light reflecting from the second reflection pattern, and a phase shifter disposed between the second reflection pattern and the first capping layer to cause an additional second phase difference portion between the first light and the second light reflecting. Each of the plurality of first stack layers includes a first sub-reflection layer and a first spacer layer which are stacked, and each of the plurality of second stack patterns includes a second sub-reflection layer and a second spacer layer which are stacked.

According to another embodiment, a reflective mask includes a first reflection layer disposed on a mask substrate, a capping layer including a ruthenium layer disposed on the first reflection layer, and a second reflection pattern disposed on a portion of the capping layer. A first light reflecting from the first reflection layer has a different phase from a second light reflecting from the second reflection pattern.

According to another embodiment, a method of fabricating a reflective mask includes forming a first reflection layer on a mask substrate, forming a ruthenium layer acting as a capping layer on the first reflection layer, forming a second reflection layer on the capping layer, forming a phase shift layer on the capping layer before forming the second reflection layer, etching the second reflection layer and the phase shift layer to form a second reflection pattern and a phase shifter, and etching a portion the second reflection layer and a portion of the phase shift layer to form a second reflection pattern and a phase shifter. The second reflection layer causes a first phase difference portion between first light reflecting from the first reflection layer and second light reflecting from the second reflection layer. The phase shift layer causes an additional second phase difference portion between first light and second light. The capping layer acts as an etch stop layer while the second reflection layer and the phase shift layer are etched.

According to another embodiment, a method of fabricating a reflective mask includes forming a first reflection layer on a mask substrate, forming a ruthenium layer acting as a capping layer on the first reflection layer, forming a second reflection layer on the capping layer, and etching a portion of the second reflection layer to form a second reflection pattern. The capping layer acts as an etch stop layer while a portion of the second reflection layer is etched.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being "on," "above", "below," or "under" another element, it can be directly "on," "above", "below," or "under" the other element, respectively, or intervening elements may also be present. Moreover, it will be understood that when an element is referred to as being "formed on" or "located on" another element, it can be "electrically connected to" or "mechanically connected to" the other element, or intervening elements may also be present. In addition, it will also be understood that when an element is referred to as being "between" two elements, it can be the only element between the two elements, or one or more intervening elements may also be present.

Figure 1:
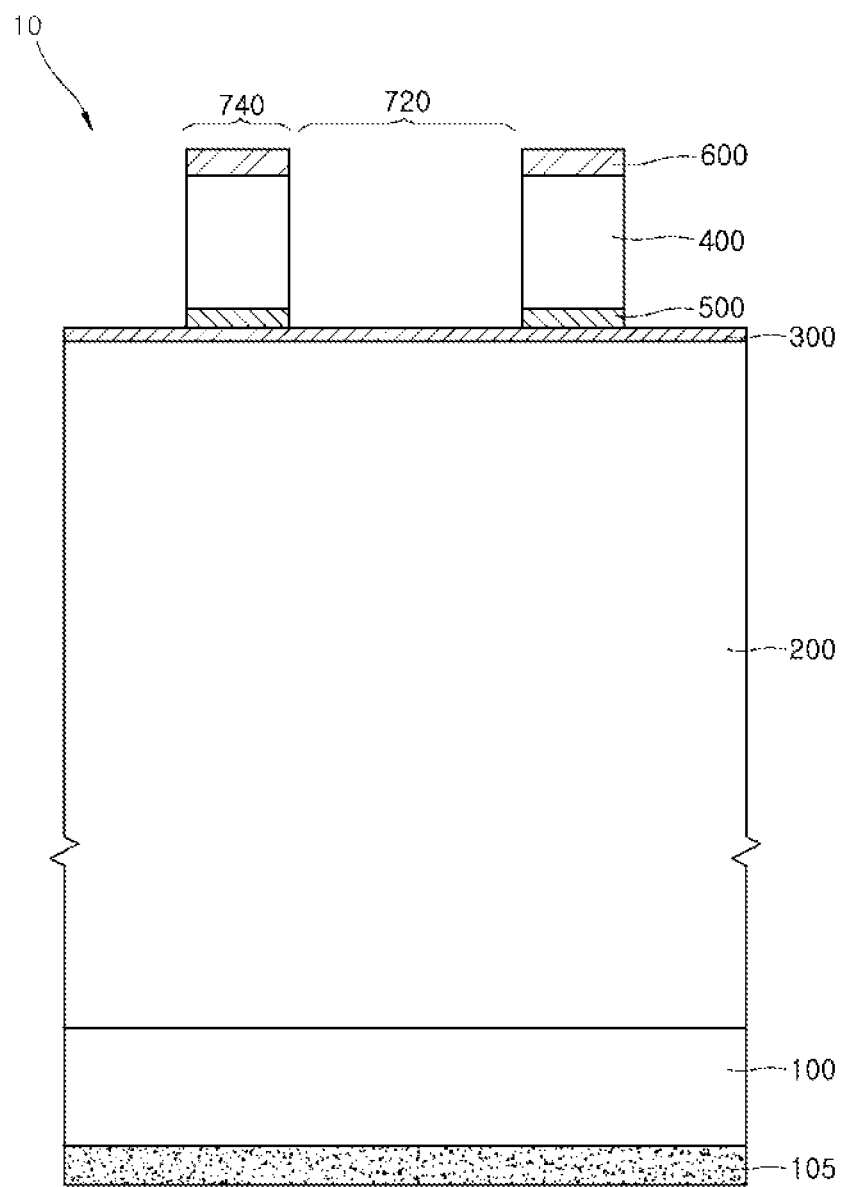
FIGS. 1 and 2 are cross-sectional views illustrating a structure and a function of a reflective mask according to an embodiment.
Figure 2:
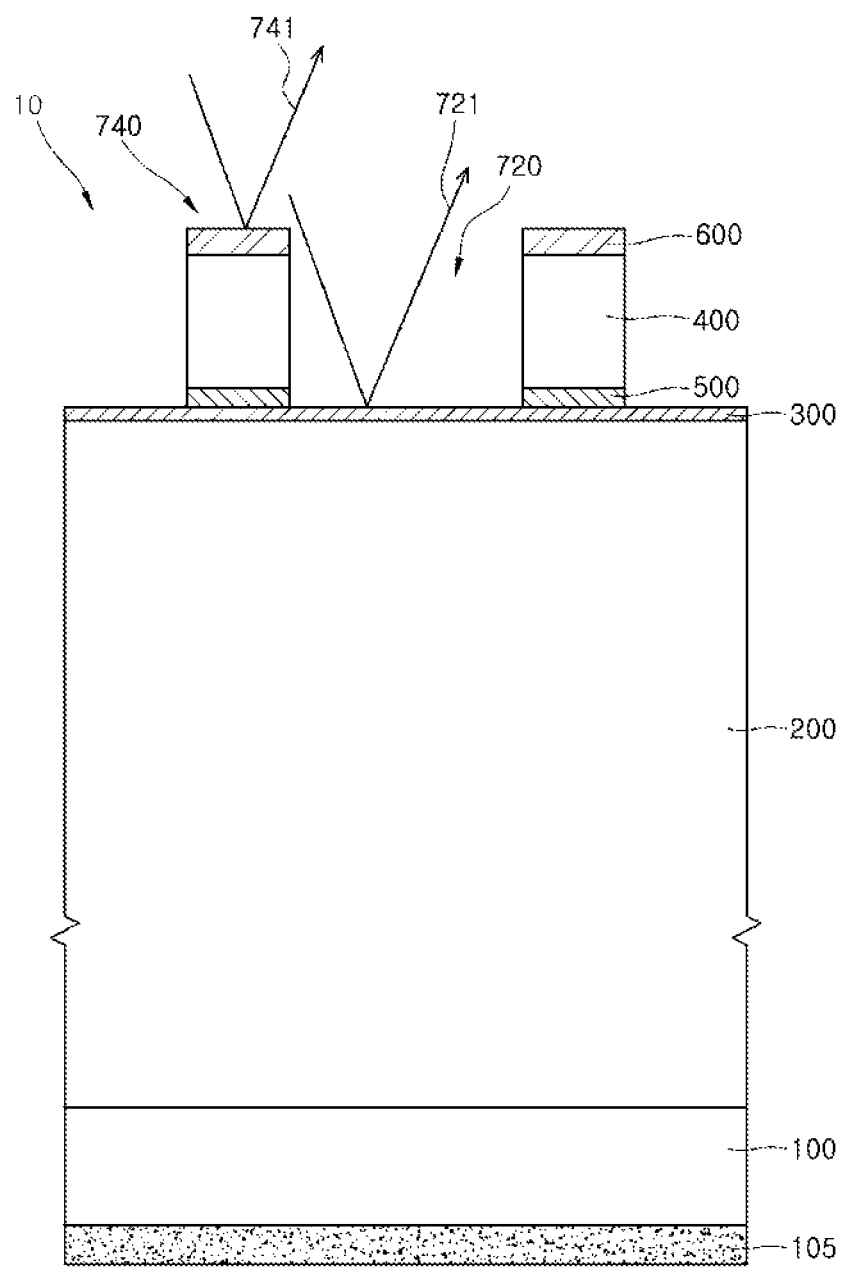

FIGS. 1 and 2 are cross-sectional views illustrating a structure and a function of a reflective mask 10 according to an embodiment.

Referring to FIG. 1, the reflective mask 10 may correspond to a EUV reflective mask used in lithographic processes utilizing EUV rays. The reflective mask 10 may include a mask substrate 100, a first reflection layer 200 disposed on a front surface of the mask substrate 100, and second reflection patterns 400 disposed on the first reflection layer 200 to provide pattern images. The reflective mask 10 may employ the second reflection patterns 400 instead of light absorption patterns to provide the pattern images which are transferred onto a wafer.

The mask substrate 100 may be comprised of a low thermal expansion coefficient material (LTEM). For example, the mask substrate 100 may be a glass substrate or a quartz substrate. A conductive layer 105 may be disposed on a back surface of the mask substrate 100. The conductive layer 105 may be used as a supporting member for fixing the reflective mask 10 on an electrostatic chuck of a lithography apparatus. The conductive layer 105 may be formed of, for example, a chrome nitride (CrN) material. The conductive layer 105 may be formed to have a mesh shape in a plan view.

Referring to FIGS. 1 and 2, the reflective mask 10 may have first reflection regions 720 in which the first reflection layer 200 is uncovered by the second reflection patterns 400 and second reflection regions 740 which are occupied by the second reflection patterns 400. In such a case, there may be a phase difference between first light 721 travelling toward and reflecting from the first reflection regions 720 and second light 741 travelling toward and reflecting from the second reflection regions 740. The second reflection patterns 400 may be provided so that the phase difference between the first light 721 reflecting from the first reflection regions 720 and the second light 741 reflecting from the second reflection regions 740 is substantially 180 degrees.

In some embodiments, the first reflection regions 720 and the second reflection regions 740 may be alternately arrayed to provide an alternating phase shift structure. In such a case, the reflective mask 10 may correspond to an alternating phase shift mask (PSM). A reflectance of the second reflection regions 740 including the second reflection patterns 400 may be substantially equal to a reflectance of the first reflection regions 720 including portions of the first reflection layer 200. For example, the second reflection regions 740 reflecting the second light 741 may have reflectance of about 62%, and the first reflection regions 720 reflecting the first light 721 may also have a reflectance of about 62%. Because a phase difference of 180 degrees exists between first light 721 and the second light 741, the second reflection patterns 400 may perform the same function as light absorption patterns do.

Referring again to FIG. 1, a first capping layer 300 may be disposed on a top surface of the first reflection layer 200 opposite to the mask substrate 100. In such a case, the second reflection patterns 400 may be disposed on the first capping layer 300. The first capping layer 300 may be disposed to protect the first reflection layer 200 from a certain process, for example, an etch process for forming the second reflection patterns 400. The first capping layer 300 may include a noble metal material, for example, a ruthenium (Ru) material. The ruthenium (Ru) material may have a high etch selectivity with respect to a material of the second reflection patterns 400. Thus, the ruthenium (Ru) material may well serve as the first capping layer 300.

The reflective mask 10 may further include second capping patterns 600 which are respectively disposed on the second reflection patterns 400. The second capping patterns 600 may protect the second reflection patterns 400 from an external environment. For example, each of the second capping patterns 600 may include a noble metal material, for example, a ruthenium (Ru) material.

Referring again to FIGS. 1 and 2, the reflective mask 10 may further include phase shifters 500 disposed between the first reflection layer 200 and the second reflection patterns 400. More specifically, if the reflective mask 10 further includes the first capping layer 300, the phase shifters 500 may be disposed between the first capping layer 300 and the second reflection patterns 400. The phase shifters 500 may change or control a phase difference between the first light 721 reflecting from the first reflection regions 720 and the second light 741 reflecting from the second reflection regions 740.

In order that the reflective mask 10 functions as an alternating PSM, a phase difference between the first light 721 and the second light 741 has to be 180 degrees and this phase difference occurs due to the presence of the second reflection patterns 400. However, a phase difference between the first light 721 and the second light 741 may be actually less than 180 degrees. In such a case, the phase shifters 500 may be employed to compensate for the phase difference and to add an additional phase difference portion between the first light 721 and the second light 741. That is, the phase shifters 500 may change a phase of the second light 741 so that a final phase difference between the first light 721 and the second light 741 is 180 degrees. A phase of the second light 741 may change according to a thickness of the phase shifters 500.

Figure 3:
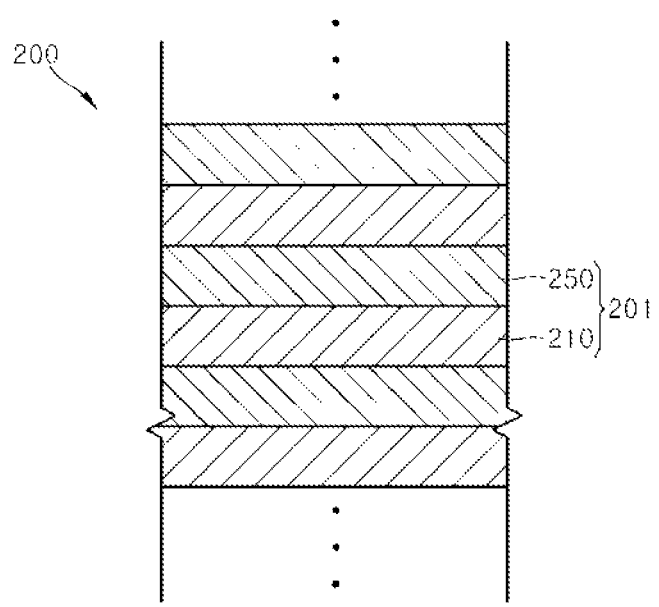
FIGS. 3 and 4 are cross-sectional views illustrating examples of a first reflection layer included in a reflective mask according to an embodiment.
Figure 4:
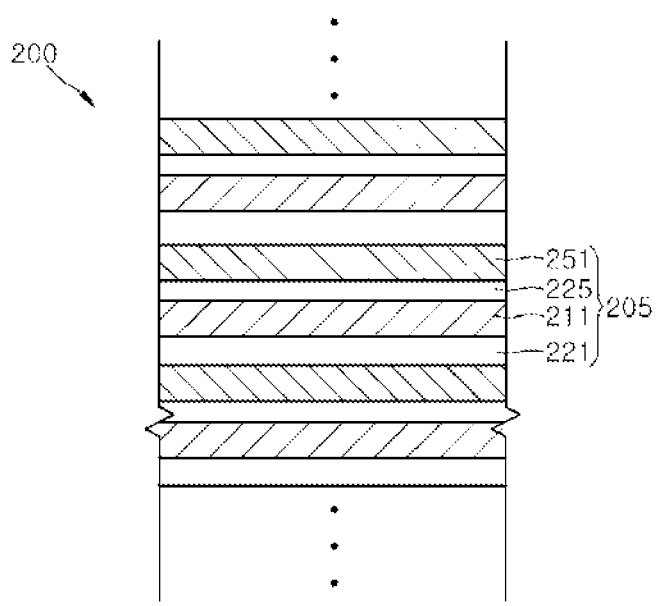

FIGS. 3 and 4 are cross-sectional views illustrating examples of the first reflection layer 200 included in the reflective mask 10 of FIGS. 1 and 2.

Referring to FIGS. 1, 2 and 3, one example of the first reflection layer 200 may include a plurality of first stack layers 201 which are stacked, and each of the first stack layers 201 may include a first sub-reflection layer 210 and a first spacer layer 250 which are sequentially stacked. That is, an example of the first reflection layer 200 may include a plurality of first sub-reflection layers 210 and a plurality of first spacer layers 250 which are alternately and repeatedly stacked. Each of the first sub-reflection layers 210 may be a high refractive layer having a refractive index which is greater than a refractive index of the first spacer layers 250. That is, each of the first spacer layers 250 may be a low refractive layer having a refractive index which is less than a refractive index of the first sub-reflection layers 210. The plurality of first stack layers 201 may be stacked to constitute a mirror structure. The first stack layer 201 including the first sub-reflection layer 210 and the first spacer layer 250 may be comprised of a combination of various material layers. For example, the first sub-reflection layer 210 may include a molybdenum (Mo) layer, and the first spacer layer 250 may include a silicon (Si) layer. That is, the first sub-reflection layer 210 may include a molybdenum/silicon (Mo/Si) pair. In some other embodiments, the first stack layer 201 may include a ruthenium/silicon (Ru/Si) pair, a molybdenum/beryllium (Mo/Be) pair, a molybdenum compound/silicon compound pair, a silicon/niobium (Si/Nb) pair, a Si/Mo/Ru stack layer, or a Si/Mo/Ru/Mo stack layer. The first reflection layer 200 may include the plurality of first stack layers 201, as described above. In an embodiment, the number of the first stack layers 201 constituting the first reflection layer 200 may be forty.

Referring to FIGS. 1, 2 and 4, the other example of the first reflection layer 200 may include a plurality of first stack layers 205 which are stacked, and each of the first stack layers 205 may include a first sub-reflection layer 211 and a first spacer layer 251 which are sequentially stacked, an intermixing layer 225 between the first sub-reflection layer 211 and the first spacer layer 251, and an intermixing layer 221 contacting a surface of the first sub-reflection layer 211 opposite to the intermixing layer 225. That is, another example of the first reflection layer 200 may include a plurality of first sub-reflection layers 211 and a plurality of first spacer layers 251 which are alternately and repeatedly stacked, and a plurality of intermixing layers 221 and 225 disposed between the first sub-reflection layers 211 and the first spacer layers 251.

If the first sub-reflection layer 211 is a molybdenum (Mo) layer and the first spacer layer 251 is a silicon (Si) layer, each of the intermixing layers 221 and 225 may be a molybdenum silicide (MoSi or $MoSi_2$) layer which is formed by a chemical reaction of molybdenum atoms diffused out of the first sub-reflection layer 211 and silicon atoms diffused out of the first spacer layer 251. In some embodiments, the molybdenum (Mo) layer corresponding to the first sub-reflection layer 211 may remain to have a thickness of about 1.9 nanometers, the silicon (Si) layer corresponding to the first spacer layer 251 may remain to have a thickness of about 2.5 nanometers which is thicker than the first sub-reflection layer 211, the first molybdenum silicide layer corresponding to the first intermixing layer 221 under the first sub-reflection layer 211 may be formed to have a thickness of about 1.8 nanometers, and the second molybdenum silicide layer corresponding to the second intermixing layer 225 under the first spacer layer 251 may be formed to have a thickness of about 0.8 nanometers which is thinner than the first intermixing layer 221.

The first intermixing layer 221 may be formed to have a different thickness from the second intermixing layer 225. As a result, each of the first stack layers 205 may have a thickness of about 7 nanometers. Similarly, each of the first stack layers 201 illustrated in FIG. 3 may also have a thickness of about 7 nanometers. Alternatively, each of the first stack layers 205 may have a thickness which is less or greater than 7 nanometers. Similarly, each of the first stack layers 201 illustrated in FIG. 3 may also have a thickness which is less or greater than 7 nanometers.

Figure 5:
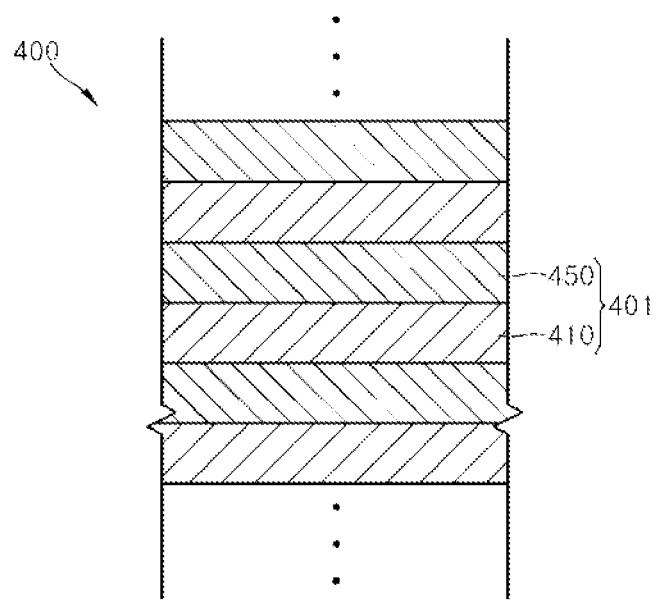
FIGS. 5 and 6 are cross-sectional views illustrating examples of a second reflection pattern included in a reflective mask according to an embodiment.
Figure 6:
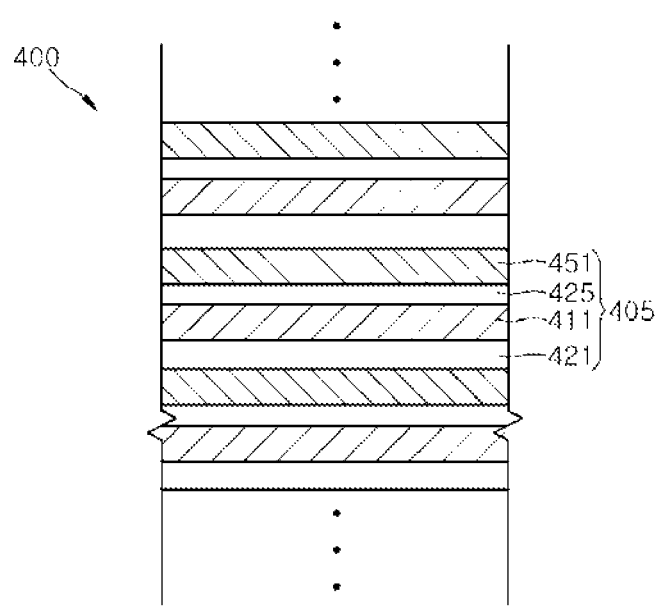

FIGS. 5 and 6 are cross-sectional views illustrating examples of the second reflection patterns 400 included in the reflective mask 10 of FIGS. 1 and 2.

Referring to FIGS. 1, 2 and 5, one example of the second reflection pattern 400 may include a plurality of second stack patterns 401 which are stacked, and each of the second stack patterns 401 may include a second sub-reflection layer 410 and a second spacer layer 450 which are sequentially stacked. That is, an example of the second reflection pattern 400 may include a plurality of second sub-reflection layers 410 and a plurality of second spacer layers 450 which are alternately and repeatedly stacked.

Each of the second sub-reflection layers 410 may be a high refractive layer having a refractive index which is greater than a refractive index of the second spacer layers 450. That is, each of the second spacer layers 450 may be a low refractive layer having a refractive index which is less than a refractive index of the second sub-reflection layers 410. The plurality of second stack patterns 401 may be stacked to constitute a mirror structure.

The second stack pattern 401 including the second sub-reflection layer 410 and the second spacer layer 450 may be comprised of a combination of various material layers. For example, the second sub-reflection layer 410 may include a molybdenum (Mo) layer, and the second spacer layer 450 may include a silicon (Si) layer. That is, the second sub-reflection layer 410 may include a molybdenum/silicon (Mo/Si) pair. In some other embodiments, the second stack pattern 401 may include a ruthenium/silicon (Ru/Si) pair, a molybdenum/beryllium (Mo/Be) pair, a molybdenum compound/silicon compound pair, a silicon/niobium (Si/Nb) pair, a Si/Mo/Ru stack layer, or a Si/Mo/Ru/Mo stack layer. The second reflection layer pattern 400 may include the plurality of second stack patterns 401, as described above. For example, the number of the second stack patterns 401 constituting the second reflection pattern 400 may be eighteen or less.

In some embodiments, the number of the second stack patterns 401 constituting the second reflection pattern 400 may be seven to seventeen to reduce a total thickness (or a total height) of the second reflection pattern 400. In particular embodiments, the number of the second stack patterns 401 constituting the second reflection pattern 400 may be nine to reduce a total thickness (or a total height) of the second reflection pattern 400.

Referring to FIGS. 1, 2 and 6, the other example of the second reflection pattern 400 may include a plurality of second stack patterns 405 which are stacked, and each of the second stack patterns 405 may include a second sub-reflection layer 411 and a second spacer layer 451 which are sequentially stacked, an intermixing layer 425 between the second sub-reflection layer 411 and the second spacer layer 451, and an intermixing layer 421 contacting a surface of the second sub-reflection layer 411 opposite to the intermixing layer 425.

Another example of the second reflection pattern 400 may include a plurality of second sub-reflection layers 411 and a plurality of second spacer layers 451 which are alternately and repeatedly stacked, and a plurality of intermixing layers 421 and 425 disposed between the second sub-reflection layers 411 and the second spacer layers 451. If the second sub-reflection layer 411 is a molybdenum (Mo) layer and the second spacer layer 451 is a silicon (Si) layer, each of the intermixing layers 421 and 425 may be a molybdenum silicide (MoSi or $MoSi_2$) layer which is formed by a chemical reaction of molybdenum atoms diffused out of the second sub-reflection layer 411 and silicon atoms diffused out of the second spacer layer 451.

In some embodiments, the molybdenum (Mo) layer corresponding to the second sub-reflection layer 411 may remain to have a thickness of about 1.9 nanometers, the silicon (Si) layer corresponding to the second spacer layer 451 may remain to have a thickness of about 2.5 nanometers which is thicker than the second sub-reflection layer 411, the first molybdenum silicide layer corresponding to the first intermixing layer 421 under the second sub-reflection layer 411 may be formed to have a thickness of about 1.8 nanometers, and the second molybdenum silicide layer corresponding to the second intermixing layer 425 under the second spacer layer 451 may be formed to have a thickness of about 0.8 nanometers which is thinner than the first intermixing layer 421.

The first intermixing layer 421 may be formed to have a different thickness from the second intermixing layer 425. As a result, each of the second stack patterns 405 may have a thickness of about 7 nanometers. Similarly, each of the second stack patterns 401 illustrated in FIG. 5 may also have a thickness of about 7 nanometers. Alternatively, each of the second stack patterns 405 may have a thickness which is less or greater than 7 nanometers. Similarly, each of the second stack patterns 401 illustrated in FIG. 5 may also have a thickness which is less or greater than 7 nanometers.

Figure 7:
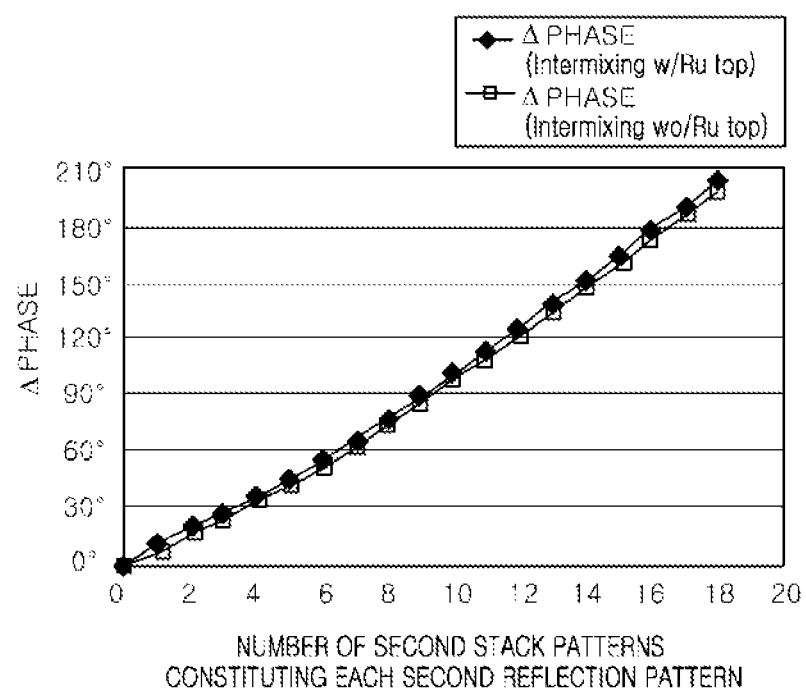
FIG. 7 is a graph illustrating a phase difference between first light and second light reflecting from the reflective mask shown in FIGS. 1 and 2 according to a pattern structure of a second reflection pattern of the reflective mask.

FIG. 7 is a graph illustrating a phase difference between the first light 721 and the second light 741 according to a pattern structure of the second reflection pattern 400 of the reflective mask 10 shown in FIG. 1 or 2. In the graph of FIG. 7, the abscissa denotes the number of the second stack patterns (401 of FIG. 5 or 405 of FIG. 6) constituting each second reflection pattern 400 shown in FIG. 1, and the ordinate denotes a phase difference (i phase) between the first light 721 and the second light 741 shown in FIG. 2.

In the graph of FIG. 7, the data plotted as "♦" indicate the phase differences (Δ phase) of the reflective masks fabricated to include the first capping layer (300 of FIG. 1) formed of a ruthenium (Ru) layer, and the data plotted as "☐" indicate the phase differences (Δ phase) of the reflective masks fabricated without the first capping layer (300 of FIG. 1). In addition, the reflective masks showing the data of FIG. 7 were fabricated without the phase shifters (500 of FIG. 1).

Referring to FIGS. 1, 5, 6 and 7, the phase difference (Δ phase) between the first light 721 and the second light 741 varied according to the number of the second stack patterns (401 or 405) constituting each second reflection pattern 400. In fabrication of various samples for obtaining the experimental results of FIG. 7, the second reflection patterns 400 were formed to have the same structure as described with reference to FIG. 6. That is, the phase difference (Δ phase) between the first light 721 and the second light 741 varied according to the number of the second stack patterns 405 constituting each second reflection pattern 400, and each of the second reflection patterns 400 was formed to include the second sub-reflection layers 411, the second spacer layers 451, and the intermixing layers 421 and 425.

To realize an alternating PSM, the phase difference (Δ phase) between the first light 721 and the second light 741 has to be 180 degrees. As can be seen from the data of FIG. 7, it may be recognized that the phase difference (Δ phase) between the first light 721 and the second light 741 is about 180 degrees when the number of the second stack patterns 405 constituting each second reflection pattern 400 is sixteen or seventeen without the phase shifters 500. Further, it may be recognized that the phase difference (Δ phase) of the reflective mask fabricated to include the first capping layer 300 is similar to the phase difference (Δ phase) of the reflective mask fabricated without the first capping layer 300.

As a thickness of the second reflection patterns 400 is reduced, the mask shadowing effect may be suppressed accordingly. Thus, it may be advantageous to reduce the number of the second stack patterns 405 constituting each second reflection pattern 400 to sixteen or less. However, in such a case, the phase difference (Δ phase) may become less than 180 degrees. Accordingly, the phase shifters 500 may be introduced into interfaces between the second reflection patterns 400 and the first capping layer 300 (or the first reflection layer 200) to compensate for the phase difference (Δ phase).

Figure 8:
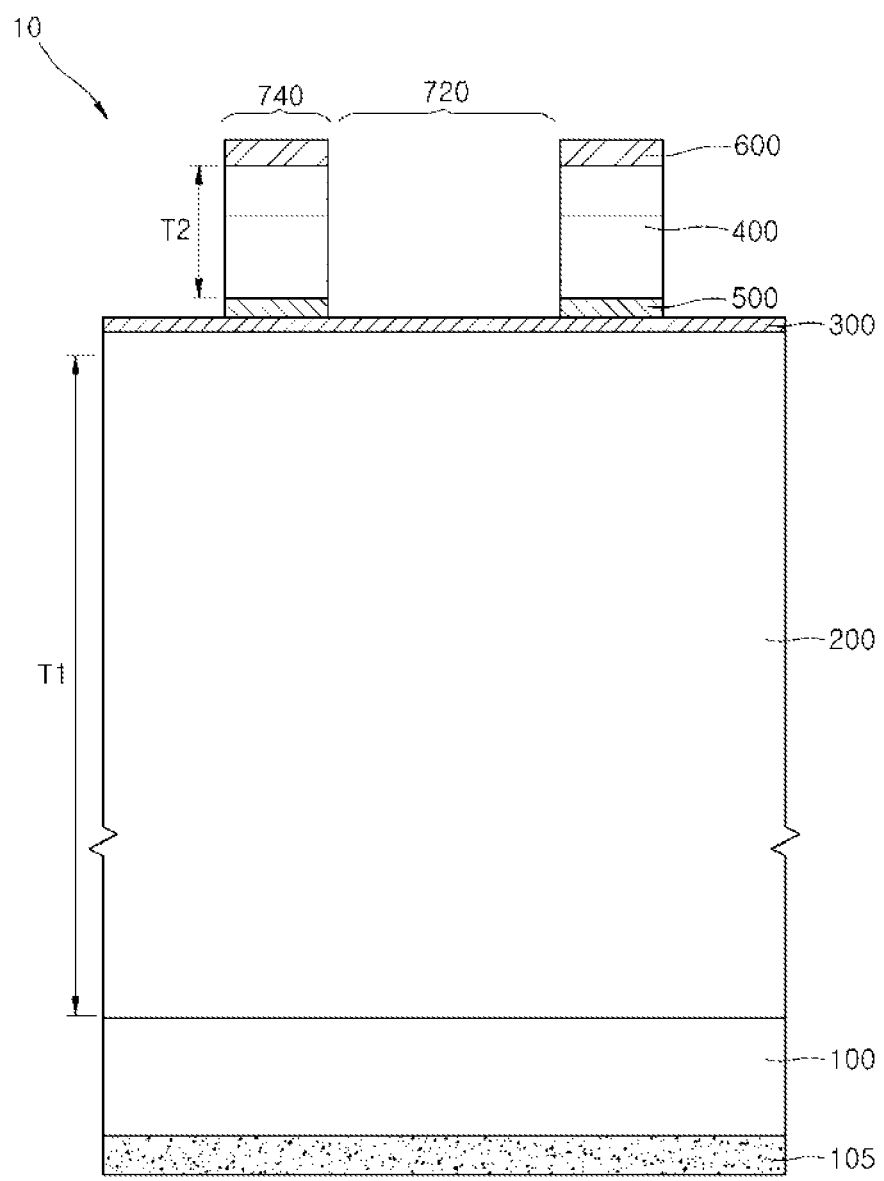
FIG. 8 is a cross-sectional view illustrating a structure of a reflective mask according to an embodiment.

FIG. 8 reproduces the reflective mask 10 shown in FIG. 1. Referring to FIG. 8, the reflective mask 10 may include the first reflection layer 200 having a first thickness T1 and the second reflection patterns 400 having a second thickness T2. The second thickness T2 of the second reflection patterns 400 may be 0.175(7/40) times to 0.45(18/40) times the first thickness T1 of the first reflection layer 200. For example, each of the second reflection patterns 400 may be formed by repeatedly stacking the second stack pattern 401 or 405 seven times to eighteen times, and the first reflection layer 200 may be formed by repeatedly stacking the first stack layer 201 or 205 forty times.

Figure 9:
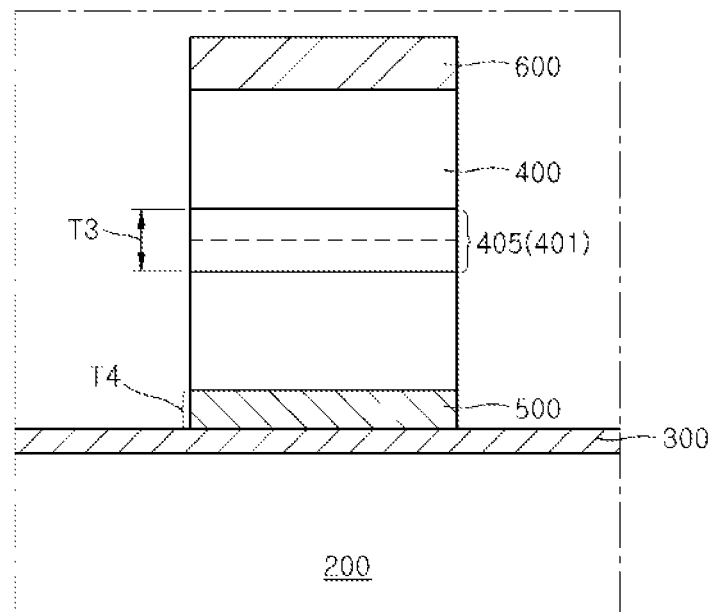
FIGS. 9 and 10 are cross-sectional views illustrating examples of a phase shifter and a second reflection pattern included in a reflective mask according to an embodiment.
Figure 10:
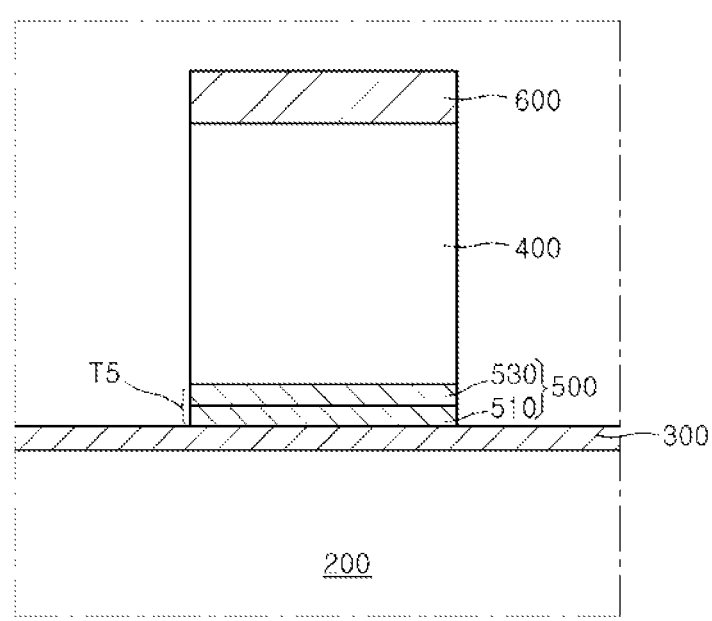

FIGS. 9 and 10 are cross-sectional views illustrating examples of the phase shifter 500 and examples of the second reflection pattern 400 included in the reflective mask 10 of FIG. 1.

Referring to FIG. 9, the phase shifter 500 may have a thickness T4 which is greater than a thickness of the first capping layer 300 and less than a thickness T3 of the second stack pattern 401 or 405. For example, the thickness T4 of the phase shifter 500 may be within the range of about 3.2 nanometers to about 7 nanometers.

The phase shifter 500 may include at least one of various material layers which are used in fabrication of the reflective mask 10 shown in FIG. 1. More specifically, the phase shifter 500 may include a silicon (Si) layer which is used in formation of the first stack layers (201 of FIG. 3) or the second stack patterns (401 of FIG. 5). The phase shifter 500 may be comprised of a single silicon layer. Alternatively, as illustrated in FIG. 10, the phase shifter 500 may include at least two different material layers, for example, a first phase shifter 510 and a second phase shifter 530 which are sequentially stacked. In such a case, the total thickness T5 of the first and second phase shifters 510 and 530 may be greater than a thickness of the first capping layer 300 and may be less than the thickness T3 of the second stack pattern 401 or 405. For example, the thickness T5 of the phase shifter 500 may be within the range of about 3.2 nanometers to about 7 nanometers. The first phase shifter 510 may be a silicon layer, and the second phase shifter 530 may be a tantalum nitride (TaN) layer or a molybdenum (Mo) layer.

Figure 11:
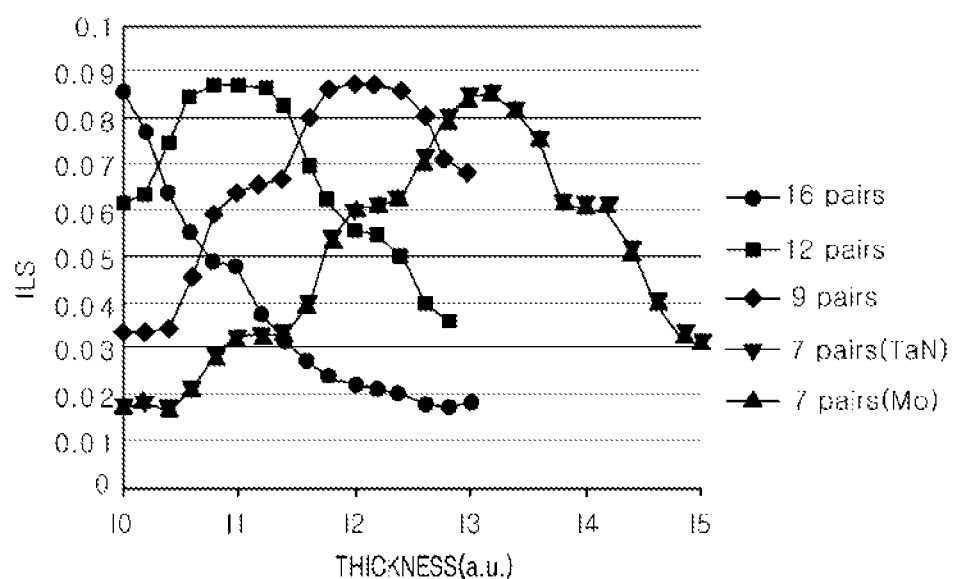
FIG. 11 is a graph illustrating an image log slope (ILS) of a reflective mask according to an embodiment.

FIG. 11 is a graph illustrating simulation results of an image log slope (ILS) of the reflective mask 10 shown in FIG. 1 according to a thickness of the phase shifter 500. In FIG. 11, the abscissa denotes a thickness of the phase shifter 500 in an arbitrary unit, and the ordinate denotes an image log slope (ILS).

Referring to FIG. 11, when an exposure step is performed using the reflective mask 10, the reflective mask 10 provides an incident light which is irradiated onto a wafer. A slope of an intensity profile of the incident light may affect a definition of pattern images, for example, a contrast characteristic of the pattern images. The slope of the incident light intensity profile may be evaluated by the image log slope (ILS). The image log slope (ILS) varied according to a thickness of the phase shifter 500, as shown in FIG. 11. Thickness indexes "I0", "I1", "I2", "I3", "I4" and "I5" on the abscissa denote arbitrary numerals.

When the number of the second stack patterns (405 of FIG. 6) constituting each second reflection pattern 400 was sixteen, a thickness of the phase shifter 500 of the reflective mask 10 showing the image log slope (ILS) over 0.06 was about 3.2 nanometers to about 3.6 nanometers. If the image log slope (ILS) is reduced, a quality of the pattern images may become lower. Thus, there may be a limitation in determining a thickness of the phase shifter 500.

When the number of the second stack patterns (405 of FIG. 6) constituting each second reflection pattern 400 was twelve, a thickness of the phase shifter 500 of the reflective mask 10 showing the image log slope (ILS) over 0.07 was about 3.6 nanometers to about 4.8 nanometers.

When the number of the second stack patterns (405 of FIG. 6) constituting each second reflection pattern 400 was seven, a thickness of the phase shifter 500 of the reflective mask 10 showing the image log slope (ILS) over 0.07 was about 5.8 nanometers to about 6.8 nanometers. In such a case, the image log slope (ILS) of the reflective mask 10 including the first phase shifter (510 of FIG. 10) formed of a silicon layer and the second phase shifter (530 of FIG. 10) formed of a tantalum nitride (TaN) layer was substantially equal to the image log slope (ILS) of the reflective mask 10 including the first phase shifter (510 of FIG. 10) formed of a silicon layer and the second phase shifter (530 of FIG. 10) formed of a molybdenum (Mo) layer.

When the number of the second stack patterns (405 of FIG. 6) constituting each second reflection pattern 400 was nine, a thickness of the phase shifter 500 of the reflective mask 10 showing the image log slope (ILS) over 0.08 was about 4.8 nanometers to about 5.6 nanometers.

As described above, it can be understood that a thickness of the phase shifter 500 increases if the number of the second stack patterns (401 of FIG. 5 or 405 of FIG. 6) constituting each second reflection pattern 400 decreases and a thickness of the phase shifter 500 decreases if the number of the second stack patterns (401 of FIG. 5 or 405 of FIG. 6) constituting each second reflection pattern 400 increases. Nevertheless, if the number of the second stack patterns (401 or 405) constituting each second reflection pattern 400 was less than seven, a quality of the pattern images was significantly degraded. The phase shifter 500 may be formed to be thinner than each of the second stack patterns (401 or 405). Alternatively, the phase shifter 500 may be formed to have substantially the same thickness as each second stack pattern (401 or 405).

Figure 12:
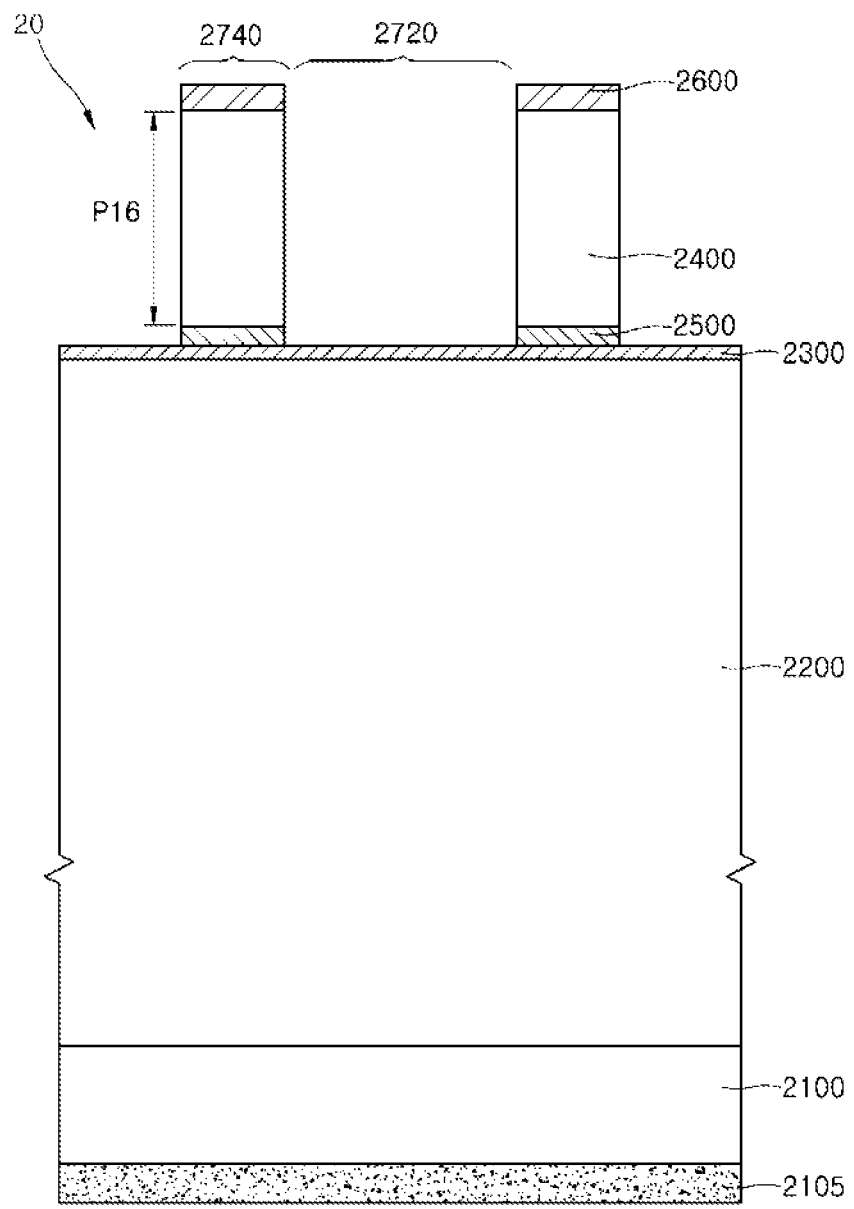
FIGS. 12 to 16 are cross-sectional views illustrating various reflective masks according to some embodiments.

FIGS. 12 to 16 are cross-sectional views illustrating various reflective masks according to some embodiments. Referring to FIG. 12, a reflective mask 20 according to an embodiment may include a mask substrate 2100, a first reflection layer 2200 disposed on a front surface of the mask substrate 2100, a first capping layer 2300 disposed on the first reflection layer 2200, second reflection patterns 2400 disposed on the first capping layer 2300, second capping patterns 2600 respectively disposed on the second reflection patterns 2400, and phase shifters 2500 disposed between the first capping layer 2300 and the second reflection patterns 2400. The reflective mask 20 may have first reflection regions 2720 in which the first reflection layer 2200 (or the first capping layer 2300) is uncovered by the second reflection patterns 2400 and second reflection regions 2740. The second reflection regions 2740 are occupied by the second reflection patterns 2400. The number of the second stack patterns (401 of FIG. 5 or 405 of FIG. 6) constituting each second reflection pattern 2400 may be sixteen (P16). A conductive layer 2105 may be disposed on a back surface of the mask substrate 2100 opposite to the first reflection layer 2200.

Figure 13:
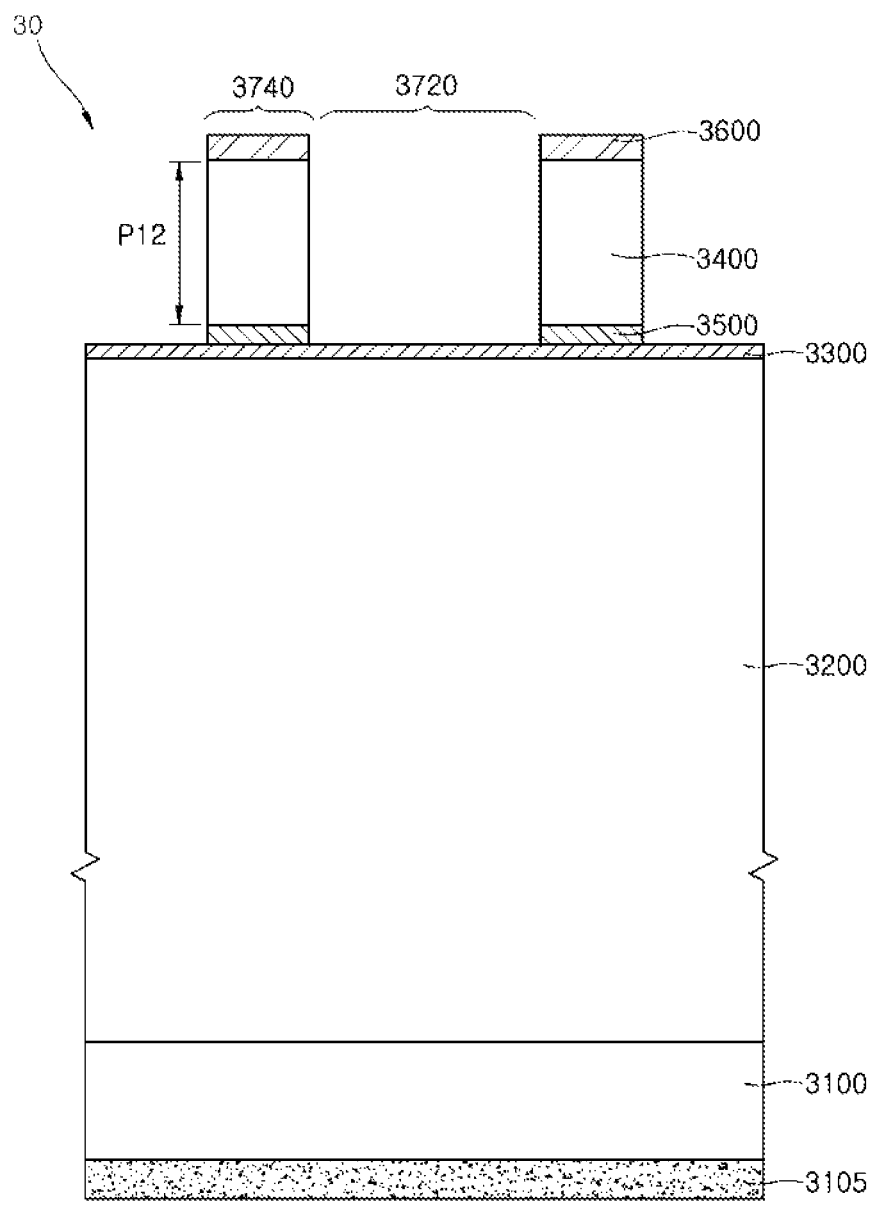

Referring to FIG. 13, a reflective mask 30 according to an embodiment may include a mask substrate 3100, a first reflection layer 3200 disposed on a front surface of the mask substrate 3100, a first capping layer 3300 disposed on the first reflection layer 3200, second reflection patterns 3400 disposed on the first capping layer 3300, second capping patterns 3600 respectively disposed on the second reflection patterns 3400, and phase shifters 3500 disposed between the first capping layer 3300 and the second reflection patterns 3400. The reflective mask 30 may have first reflection regions 3720 in which the first reflection layer 3200 (or the first capping layer 3300) is uncovered by the second reflection patterns 3400 and second reflection regions 3740 which are occupied by the second reflection patterns 3400. The number of the second stack patterns (401 of FIG. 5 or 405 of FIG. 6) constituting each second reflection pattern 3400 may be twelve (P12). A conductive layer 3105 may be disposed on a back surface of the mask substrate 3100 opposite to the first reflection layer 3200.

Figure 14:
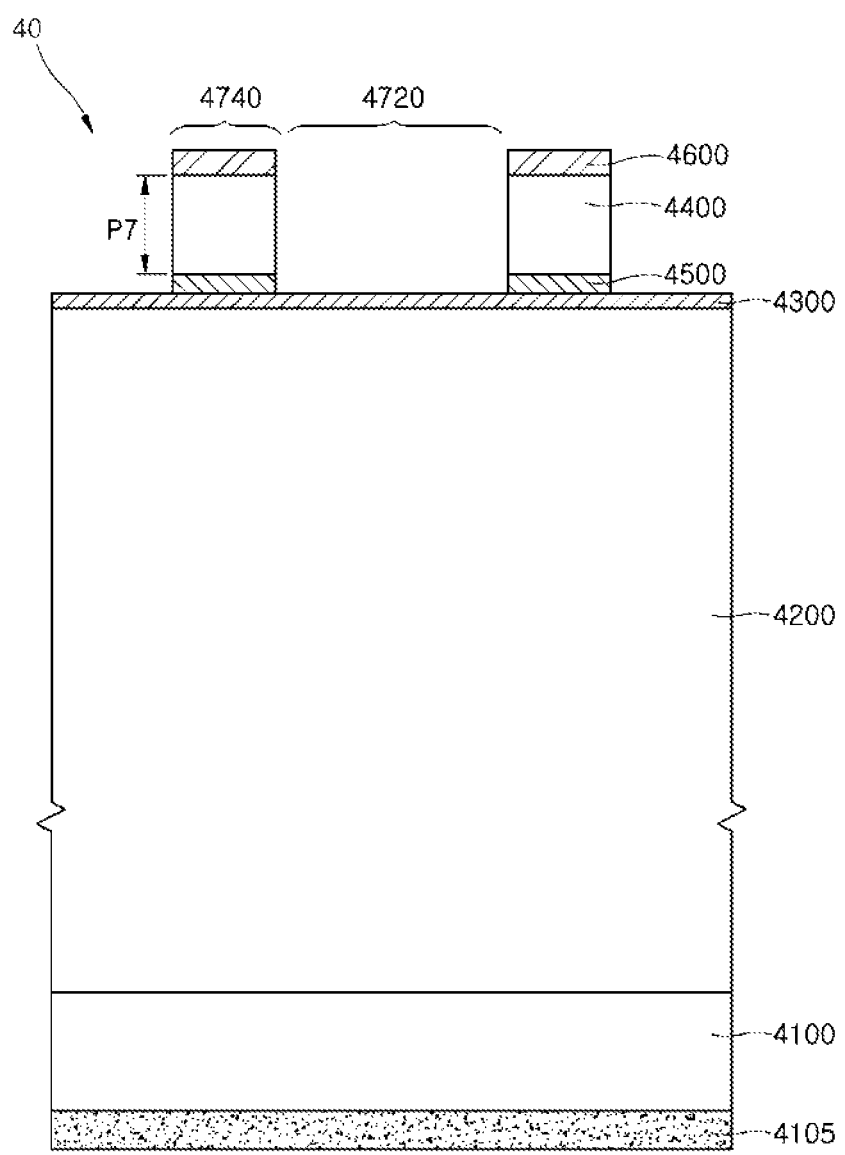

Referring to FIG. 14, a reflective mask 40 according to an embodiment may include a mask substrate 4100, a first reflection layer 4200 disposed on a front surface of the mask substrate 4100, a first capping layer 4300 disposed on the first reflection layer 4200, second reflection patterns 4400 disposed on the first capping layer 4300, second capping patterns 4600 respectively disposed on the second reflection patterns 4400, and phase shifters 4500 disposed between the first capping layer 4300 and the second reflection patterns 4400. The reflective mask 40 may have first reflection regions 4720 in which the first reflection layer 4200 (or the first capping layer 4300) is uncovered by the second reflection patterns 4400 and second reflection regions 4740 which are occupied by the second reflection patterns 4400. The number of the second stack patterns (401 of FIG. 5 or 405 of FIG. 6) constituting each second reflection pattern 4400 may be seven (P7). A conductive layer 4105 may be disposed on a back surface of the mask substrate 4100 opposite to the first reflection layer 4200.

Figure 15:
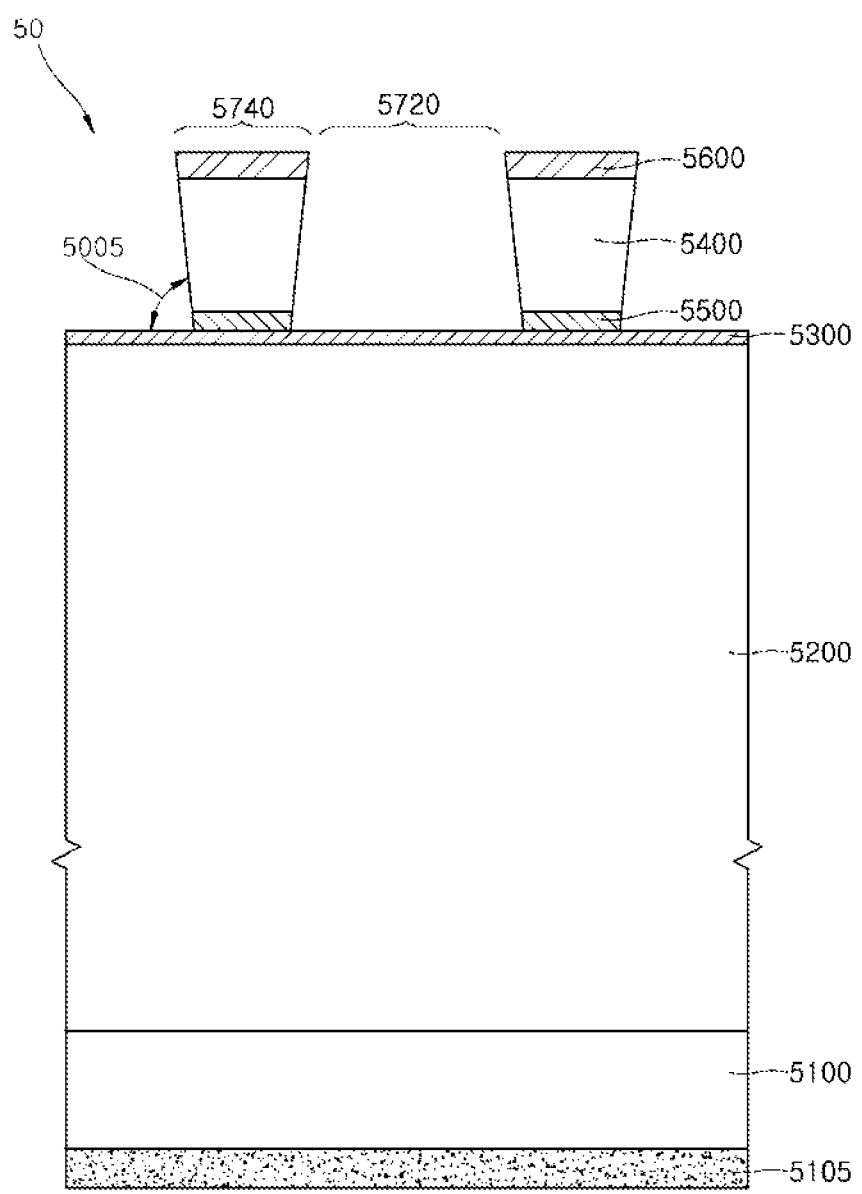

Referring to FIG. 15, a reflective mask 50 according to an embodiment may include a mask substrate 5100, a first reflection layer 5200 disposed on a front surface of the mask substrate 5100, a first capping layer 5300 disposed on the first reflection layer 5200, second reflection patterns 5400 disposed on the first capping layer 5300, second capping patterns 5600 respectively disposed on the second reflection patterns 5400, and phase shifters 5500 disposed between the first capping layer 5300 and the second reflection patterns 5400. The reflective mask 50 may have first reflection regions 5720 in which the first reflection layer 5200 (or the first capping layer 5300) is uncovered by the second reflection patterns 5400 and second reflection regions 5740 which are occupied by the second reflection patterns 5400. Sidewalls of the second reflection patterns 5400 may have a negative sloped profile so that an angle 5005 between a sidewall of each second reflection pattern 5400 and a top surface of the first capping layer 5300 is less than 90 degrees. A conductive layer 5105 may be disposed on a back surface of the mask substrate 5100 opposite to the first reflection layer 5200.

Figure 16:
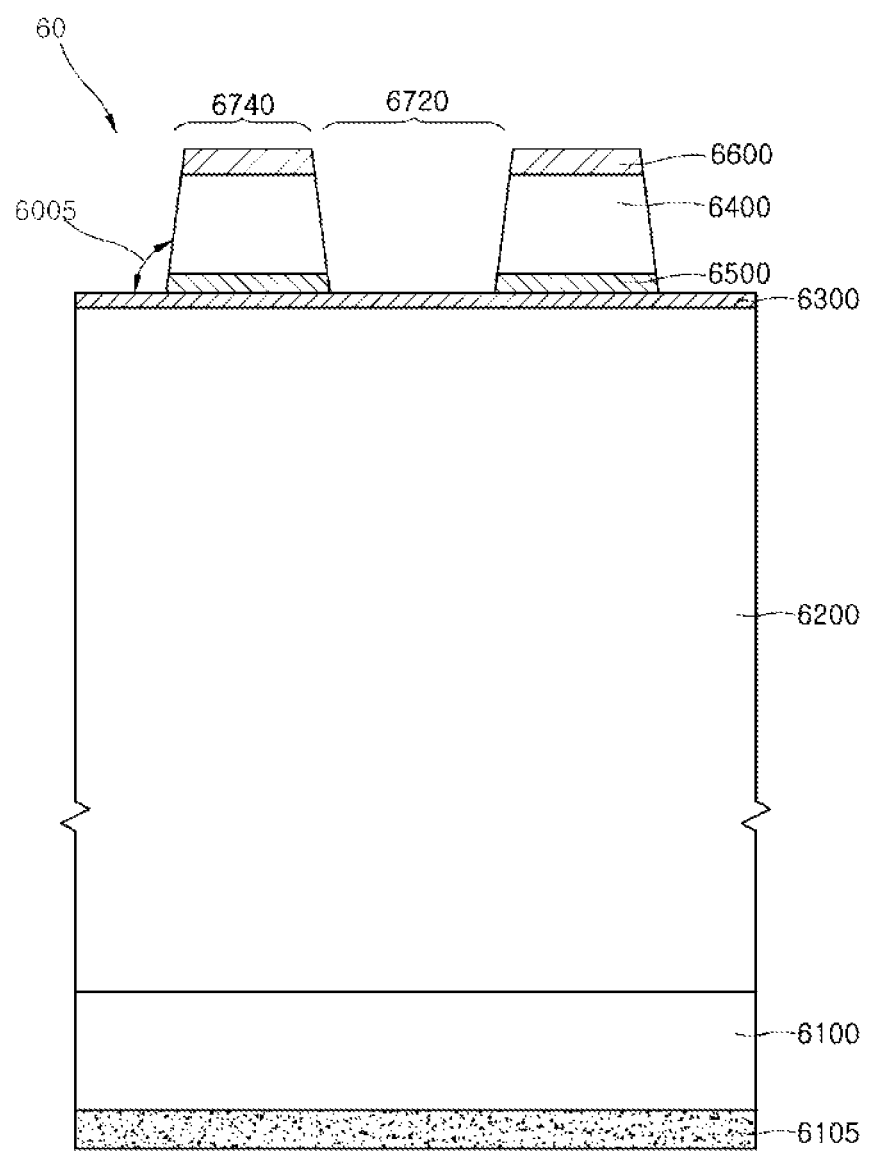

Referring to FIG. 16, a reflective mask 60 according to an embodiment may include a mask substrate 6100, a first reflection layer 6200 disposed on a front surface of the mask substrate 6100, a first capping layer 6300 disposed on the first reflection layer 6200, second reflection patterns 6400 disposed on the first capping layer 6300, second capping patterns 6600 respectively disposed on the second reflection patterns 6400, and phase shifters 6500 disposed between the first capping layer 6300 and the second reflection patterns 6400. The reflective mask 60 may have first reflection regions 6720 in which the first reflection layer 6200 (or the first capping layer 6300) is uncovered by the second reflection patterns 6400 and second reflection regions 6740 which are occupied by the second reflection patterns 6400. Sidewalls of the second reflection patterns 6400 may have a positive sloped profile so that an angle 6005 between a sidewall of each second reflection pattern 6400 and a top surface of the first capping layer 6300 is greater than 90 degrees. A conductive layer 6105 may be disposed on a back surface of the mask substrate 6100 opposite to the first reflection layer 6200.

Figure 17:
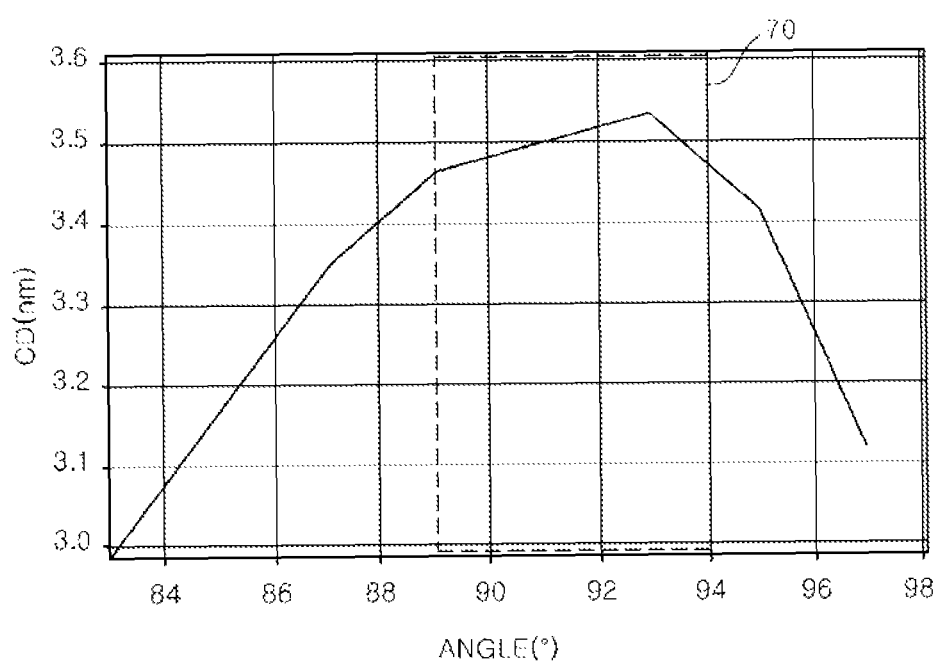
FIG. 17 is a graph illustrating a measurement result of line widths of patterns formed using various reflective masks according to some embodiments.

FIG. 17 is a graph illustrating widths of line-shaped patterns formed using various reflective masks according to some embodiments. In FIG. 17, the abscissa denotes an angle 5005 or 6005 shown in FIG. 15 or 16, and the ordinate denotes a width CD of the line-shaped patterns.

Referring to FIG. 17, the line width CD of the line-shaped patterns formed using the reflective mask (50 of FIG. 15 or 60 of FIG. 16) varied according to a sidewall profile of the second reflection patterns (5400 of FIG. 15 or 6400 of FIG. 16). In particular, a variation rate of the line width CD measured when the sidewalls of the second reflection patterns have a negative sloped profile was greater than a variation rate of the line width CD measured when the sidewalls of the second reflection patterns have a positive sloped profile. In consideration of the variation rate of the line width CD, the second reflection patterns (5400 of FIG. 15 or 6400 of FIG. 16) may be formed to have the sidewall angle 5005 or 6005 of about 83 degrees to about 97 degrees. More specifically, a variation rate of the line widths CD was relatively low in an area 70 plotted by a dotted line of FIG. 17. Thus, the second reflection patterns (5400 of FIG. 15 or 6400 of FIG. 16) may be formed to have the sidewall angle 5005 or 6005 of about 89 degrees to about 94 degrees.

Figure 18:
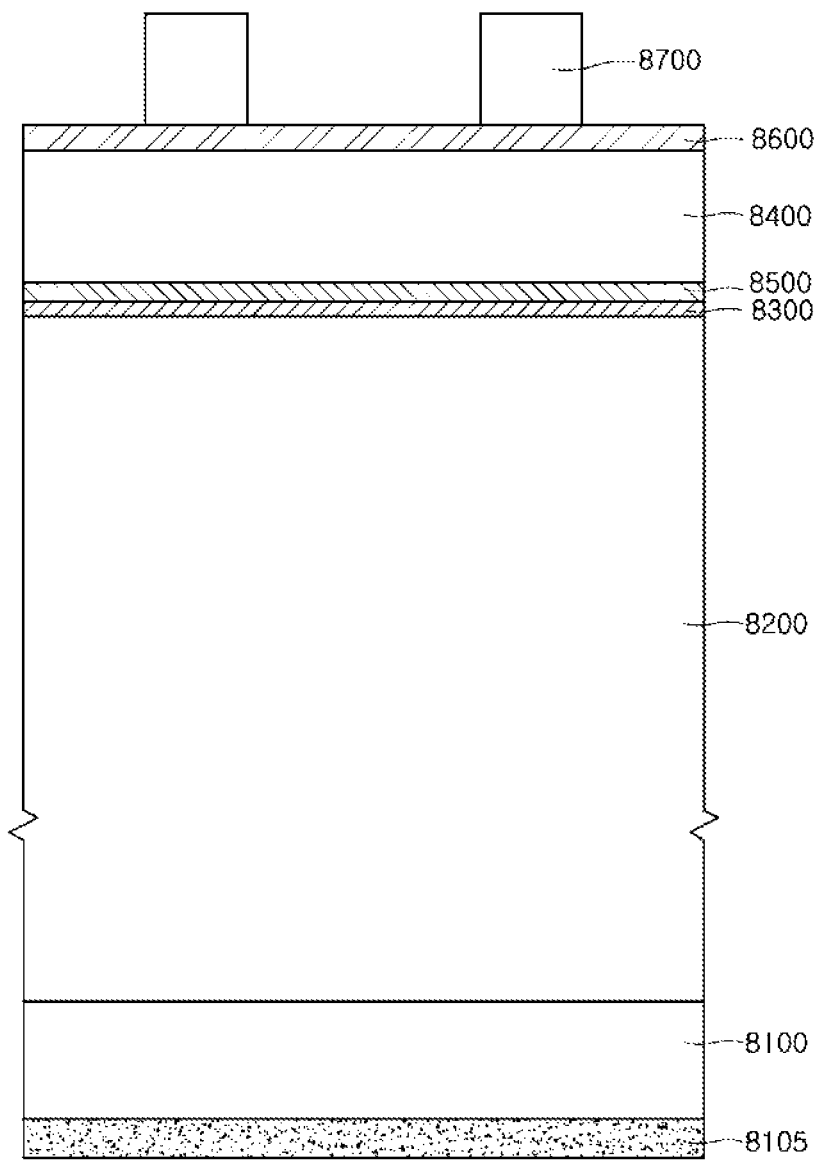
FIGS. 18, 19 and 20 are cross-sectional views illustrating a method of fabricating a reflective mask according to an embodiment.
Figure 19:
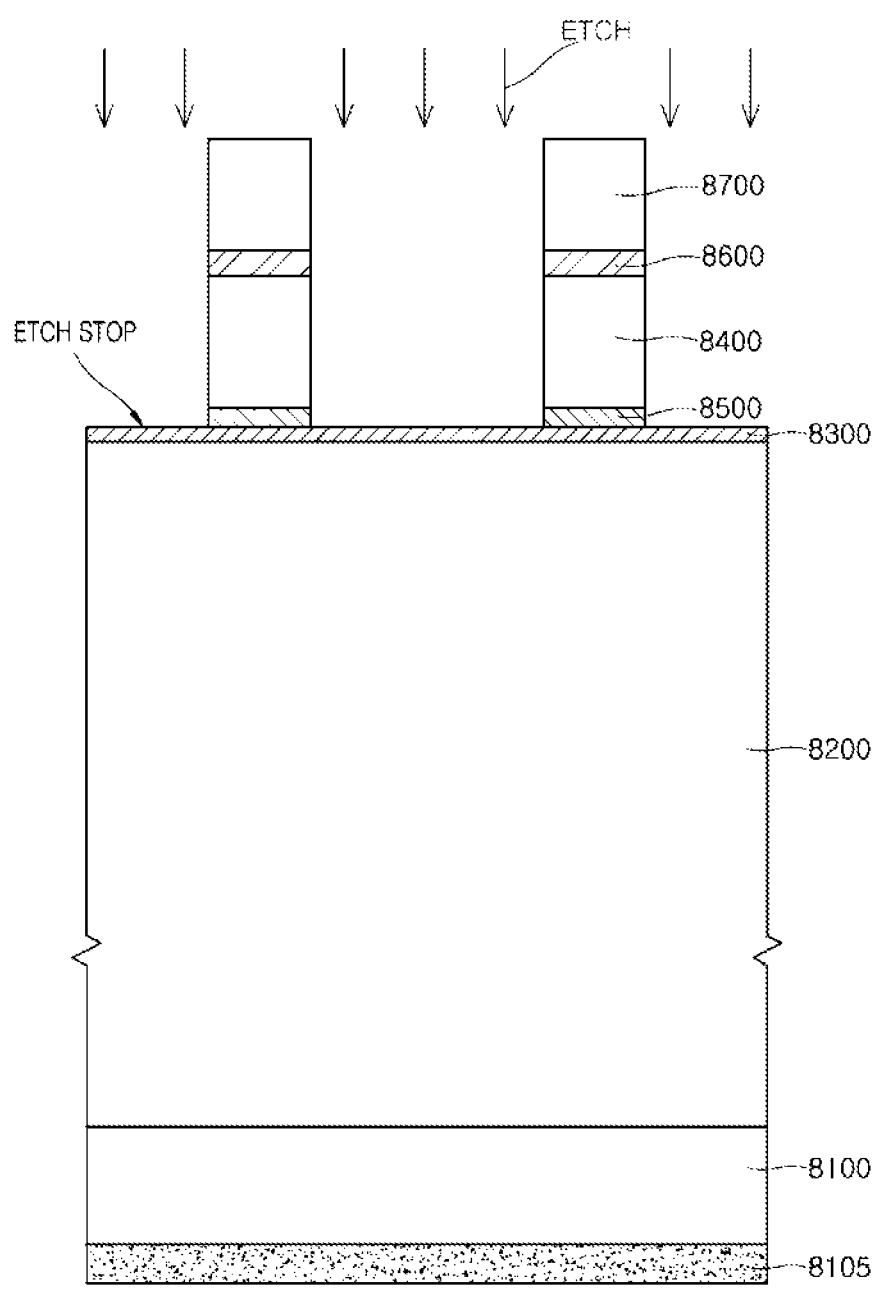
Figure 20:
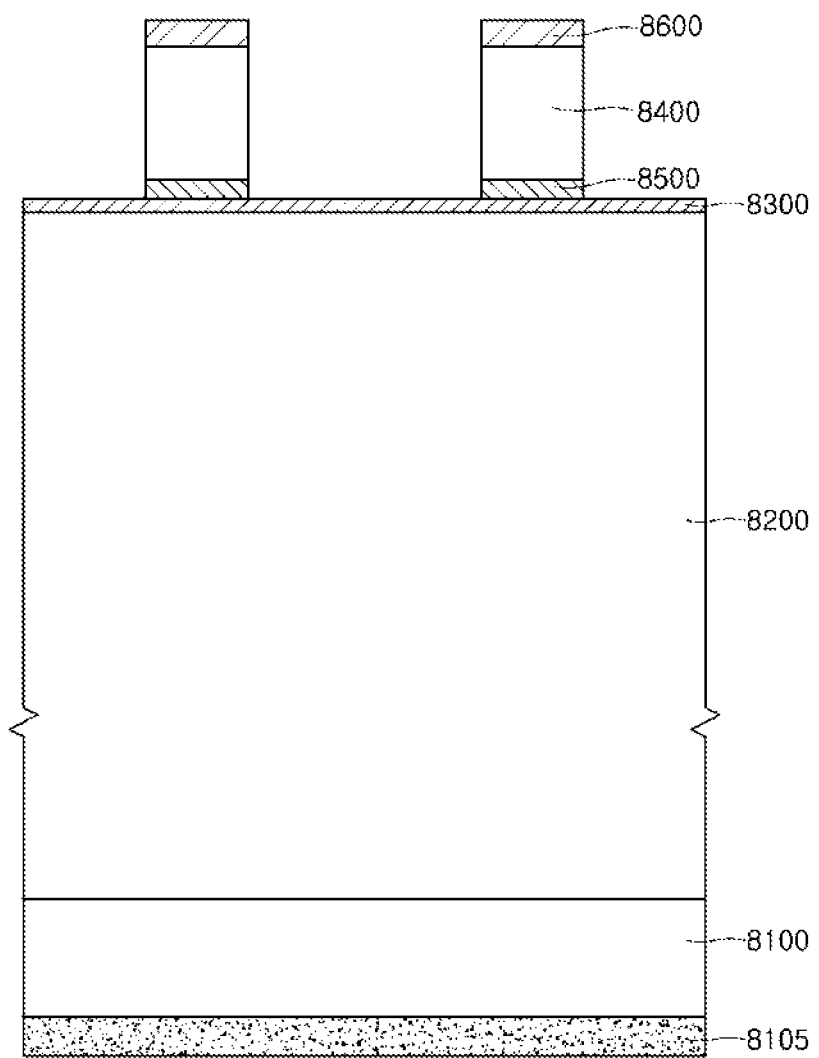

FIGS. 18, 19 and 20 are cross-sectional views illustrating a method of fabricating a reflective mask according to an embodiment.

Referring to FIG. 18, a first reflection layer 8200 may be formed on a front surface of a mask substrate 8100. A conductive layer 8105 may be attached to a back surface of the mask substrate 8100 before the first reflection layer 8200 is formed. The first reflection layer 8200 may be formed by sequentially stacking first stack layers (201 of FIG. 3 or 205 of FIG. 4), as described with reference to FIGS. 3 and 4. A first capping layer 8300 may be formed on the first reflection layer 8200. The first capping layer 8300 may be formed of a ruthenium (Ru) layer and have a thickness of about 2.5 nanometers. A phase shift layer 8500 may be formed on the first capping layer 8300. A second reflection layer 8400 may be formed on the phase shift layer 8500. The second reflection layer 8400 may be formed by sequentially stacking second stack layers (401 of FIG. 5 or 405 of FIG. 6), as described with reference to FIGS. 5 and 6. A second capping layer 8600, for example, a ruthenium (Ru) layer may be formed on the second reflection layer 8400. An etch mask 8700 may be formed on the second capping layer 8600. The etch mask 8700 may be formed to include a tantalum boron nitride (TaBN) layer.

Referring to FIG. 19, the second capping layer 8600, the second reflection layer 8400 and the phase shift layer 8500 may be etched using the etch mask 8700 to form second reflection patterns 8400 and phase shifters 8500 between the first capping layer 8300 and the second reflection patterns 8400. In such a case, the first capping layer 8300 may act as an etch stop layer.

Referring to FIG. 20, the etch mask (8700 of FIG. 19) may be selectively removed to complete a reflective mask. The present disclosure may provide reflective masks having a phase shift mask shape. Phase shift occurs when using reflection patterns instead of light absorption patterns. That is, the phase shift effect may be obtained using only EUV rays reflected from the reflection patterns without use of light absorption patterns. As a result, a mask shadowing effect may be suppressed, a throughput of the reflective masks may be improved, contrast characteristics improve, and exposure energy necessary for fabrication of the reflective masks may be reduced.

What is claimed is:
1. A reflective mask comprising:
   a first reflection layer disposed over a mask substrate;
   a first capping layer disposed over the first reflection layer;
   a second reflection pattern disposed over a portion of the first capping layer to cause a first phase difference portion between first light reflecting from the first reflection layer and second light reflecting from the second reflection pattern; and
   a phase shifter disposed between the second reflection pattern and the first capping layer to cause an additional second phase difference portion between the first light reflecting and the second light reflecting.
2. The reflective mask of claim 1,
   wherein the first reflection layer includes N number of first stack layers,
   wherein each of the first stack layers includes a first sub-reflection layer and a first spacer layer,
   wherein the second reflection pattern includes M number of second stack patterns, wherein each of the second stack patterns includes a second sub-reflection layer and a second spacer layer,
wherein N is an integer and M is an integer, and
wherein M is less than N.

3. The reflective mask of claim 2,
wherein a refractive index of the first sub-reflection layer is higher than a refractive index of the first spacer layer, and
wherein a refractive index of the second sub-reflection layer is higher than a refractive index of the second spacer layer.

4. The reflective mask of claim 2,
wherein the second sub-reflection layer includes a molybdenum (Mo) layer, and
wherein the second spacer layer includes a silicon (Si) layer.

5. The reflective mask of claim 2,
wherein each of the second stack patterns further includes an intermixing layer,
wherein the intermixing layer is disposed between the second sub-reflection layer and the second spacer layer.

6. The reflective mask of claim 2,
wherein the first phase difference portion becomes less than 180 degrees, and
wherein a thickness of the phase shifter is set to a value at which a total phase difference including the second phase difference portion and the first phase difference portion becomes substantially 180 degrees.

7. The reflective mask of claim 6,
wherein M is an integer between 7 and 18, inclusive, and
wherein the thickness of the phase shifter is greater than a thickness of the first capping layer and is less than a thickness of each of the second stack patterns.

8. The reflective mask of claim 6,
wherein M is an integer between 7 and 16, inclusive, and
wherein the thickness of the phase shifter is greater than a thickness of the first capping layer and is less than a thickness of each of the second stack patterns.

9. The reflective mask of claim 8, wherein the phase shifter has a thickness of about 3.2 nanometers to about 7 nanometers.

10. The reflective mask of claim 6,
wherein M is 9, and
wherein the phase shifter has a thickness of about 4.8 nanometers to about 5.6 nanometers.

11. The reflective mask of claim 6,
wherein M is 7, and
wherein the phase shifter has a thickness of about 5.8 nanometers to about 6.8 nanometers.

12. The reflective mask of claim 6,
wherein M is 12, and
wherein the phase shifter has a thickness of about 3.6 nanometers to about 4.8 nanometers.

13. The reflective mask of claim 6,
wherein M is 16, and
wherein the phase shifter has a thickness of about 3.2 nanometers to about 3.6 nanometers.

14. The reflective mask of claim 1, wherein the phase shifter includes at least two different material layers which are stacked.

15. The reflective mask of claim 14, wherein the phase shifter includes two different material layers selected from the group consisting of a silicon layer, a tantalum nitride layer, and a molybdenum layer.

16. The reflective mask of claim 1, wherein the first capping layer includes a ruthenium layer.

17. The reflective mask of claim 1, wherein an angle between a sidewall of the second reflection pattern and a top surface of the first capping layer is within the range of about 83 degrees to about 97 degrees.

18. The reflective mask of claim 1, wherein an angle between a sidewall of the second reflection pattern and a top surface of the first capping layer is within the range of about 89 degrees to about 94 degrees.

19. A reflective mask comprising:
a first reflection layer including N number of first stack layers which are stacked over a mask substrate, wherein each of the first stack layers includes a first sub-reflection layer and a first spacer layer;
a first capping layer disposed over the first reflection layer;
a second reflection pattern including M number of second stack patterns which are stacked over a portion of the first capping layer, wherein each of the second stack patterns includes a second sub-reflection layer and a second spacer layer and the second reflection pattern causes a first phase difference portion between first light reflecting from the first reflection layer and second light reflecting from the second reflection pattern; and
a phase shifter disposed between the second reflection pattern and the first capping layer to cause an additional second phase difference portion between the first light reflecting and the second light reflecting,
wherein N is an integer and M is integer.

20. A reflective mask comprising:
a first reflection layer disposed over a mask substrate;
a capping layer including a ruthenium layer and disposed over the first reflection layer; and
a second reflection pattern disposed over a portion of the capping layer,
wherein first light reflecting from the first reflection layer has a different phase from second light reflecting from the second reflection pattern.

* * * * *